United States Patent [19]

Chen et al.

[11] Patent Number: 4,745,447
[45] Date of Patent: May 17, 1988

[54] GALLIUM ARSENIDE ON GALLIUM INDIUM ARSENIDE SCHOTTKY BARRIER DEVICE

[75] Inventors: Chung Y. Chen, New Providence; Alfred Y. Cho, Summit; Sung-Nee G. Chu, New Providence, all of N.J.

[73] Assignee: American Telephone and Telegraph Company, AT&T Bell Laboratories, Murray Hill, N.J.

[21] Appl. No.: 745,294

[22] Filed: Jun. 14, 1985

[51] Int. Cl.$^4$ .................. H01L 29/201; H01L 29/56; H01L 29/80
[52] U.S. Cl. ........................................ 357/22; 357/15; 357/16
[58] Field of Search ............. 357/22 A, 22 MD, 22 I, 357/22 L, 16, 15

[56] References Cited

U.S. PATENT DOCUMENTS 3,218,205  11/1965  Ruehrwein ........................... 357/16
4,173,764  11/1979  de Cremoux ....................... 357/22 A
4,360,246  11/1982  Figueroa et al. ..................... 357/16
4,455,564   6/1984  Delagebeaudeuf ............... 357/22 A

FOREIGN PATENT DOCUMENTS 58-147166  9/1983  Japan ........................... 357/22 MD

OTHER PUBLICATIONS

Zipperian et al, "An $In_{0.2}Ga_{0.8}As$/GaAs . . . Transistor", IEDM 1983, pp. 696–699, Wash., D.C.
Fukuzawa et al, "Monolithic . . . Transistor", *Appl. Phys. Lett.*, 36 (3), 1 Feb. 1980, pp. 181–183.
Ohno et al, "Double Heterostructure . . . MBE", *IEEE Elec. Dev. Lett.*, vol. EDL-1, No. 8, Aug. 1980.

*Primary Examiner*—Andrew J. James
*Assistant Examiner*—Jerome Jackson, Jr.
*Attorney, Agent, or Firm*—Walter G. Nilsen

[57] ABSTRACT

Useful field effect transistors can be made with gallium indium arsenide as the electron conducting layer (channel layer) by incorporating a layer of gallium arsenide for the Schottky barrier. Relatively thick gallium arsenide layers are used to achieve low reverse leakage currents.

10 Claims, 2 Drawing Sheets

GALLIUM ARSENIDE ON GALLIUM INDIUM ARSENIDE SCHOTTKY BARRIER DEVICE

TECHNICAL FIELD

The invention is a semiconductor device, more particularly, a field effect transistor.

BACKGROUND OF THE INVENTION

Rapid development in both communication technology and computer technology has led to the requirement for higher speed circuits, more sensitive circuits and higher gain circuits. Such requirements have arisen at the same time as the further development of integrated circuit technology in which high packing densities in integrated circuits have become highly desirable.

Optical communication technology provides an illustrative example. Optical communication has been developing at a rapid rate during the last few years. High sensitivity in receivers is desirable because it increases the distance between repeaters and reduces the number of repeaters in a particular communication system. Also of importance in optical communication systems is high speed amplifiers which permit high bit rates to be transmitted. High speed amplifier systems are also of use in other types of circuits including logic circuits, memory circuits, analog switching, high-input-impedance amplifiers, integrated circuits, etc.

One of the most promising compound semiconductors for high speed, high gain devices is indium gallium arsenide and related compounds such as indium gallium arsenide phosphide. This is due to the high mobility and peak electron velocity exhibited by the III-V compound semiconductors. A particular difficulty is in fabricating suitable devices to take advantage of these properties. For example, the low barrier heights impose a limitation on the usefulness of Schottky barrier gates for MESFETS with indium gallium arsenide channel layers. Various corrective measures can be used to improve the barrier height characteristics, but a reliable process to produce such devices with reproducible characteristics has not been found.

A possible approach to this problem is to interpose a thin layer of insulator material or wide band-gap material between metal and channel layer to produce the required barrier height for the control gate. Attempts to use a thin layer of gallium arsenide as the barrier material resulted in unacceptably high reverse bias currents (see for example C. Y. Chen et al, *IEEE Electron Device Letters*, Vol. EDL-6, No. 1, January 1985.

SUMMARY OF THE INVENTION

The invention is a semiconductor device with a channel layer comprising indium phosphide or a III-V semiconductor compound lattice-matched to indium phosphide in which gallium arsenide is used as the barrier material. Relatively thick barrier layers are used to insure low reverse leakage currents. Satisfactory results are obtained with barrier layer thicknesses of greater than 700 Angstrom units but preferred thicknesses are greater than 800, 1000 or even 1500 Angstrom units. Thicknesses greater than 3000–4000 Angstrom units still yield excellent results but are not significantly better than 1500 Angstrom units and are wasteful of material and processing time. Also, with barrier layer thicknesses in excess of 3000–4000 Angstrom units, dislocations are more likely to result from the lattice strain, and device characteristics depending on field penetration into the channel layer might not be optimum. Typical structures have indium gallium arsenide as the channel material and indium phosphide as the substrate material. Devices made in accordance with the invention have high speeds, high transconductance and are suitable for integration with optical indium phosphide devices (e.g., photodetectors, lasers, etc.).

DETAILED DESCRIPTION

The invention is based on the discovery that gallium arsenide layers in a certain thickness range, when deposited on a mismatched layer such as InP or $Ga_{0.47}In_{0.53}As$, can yield very low gate leakage currents. Such layers are useful in a variety of semiconductor structures. These GaAs layers form Schottky barriers with reasonable barrier heights and low reverse-bias leakage currents. Such barrier structures are useful in a variety of semiconductor structures, particularly where the basic layer exhibits only low Schottky barrier heights. For example, it is useful for gate electrodes in field effect transistors where the substrate material is indium phosphide and the channel material is indium phosphide or a semiconductor lattice-matched to indium phosphide (e.g., indium gallium arsenide with approximate composition $In_{0.53}Ga_{0.47}As$ or indium aluminum arsenide with approximate composition $In_{0.52}Al_{0.48}As$). The gallium arsenide layers produce increased Schottky barrier heights which reduces the reverse bias current.

In general terms, the invention involves use of gallium arsenide in a certain thickness range as a lattice-mismatched layer on indium gallium arsenide to produce a Schottky barrier with reasonable height. At present, the most significant applications of such a structural element is with field effect transistors. The preferred channel material is indium gallium arsenide, particularly the composition of indium gallium arsenide that is lattice-matched to indium phosphide. There are two reasons why indium gallium arsenide is an important channel material: first, it has high low-field electron mobility, and, second, it can be lattice-matched to indium phosphide useful for a variety of long-wavelength lightwave integrated circuits. Particularly useful are integrated detector circuits for lightwave receivers and laser driver circuits as well as arrays of FET circuits for fast memories and logic circuits.

Figure 1:
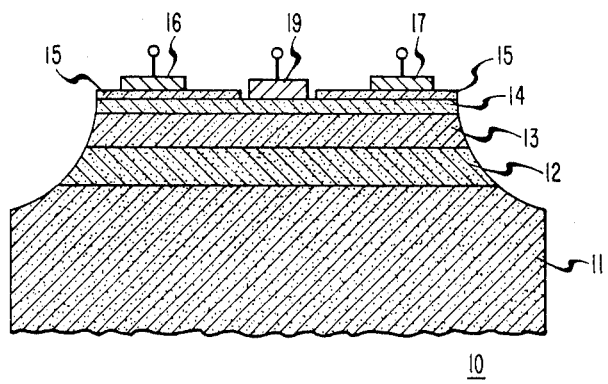
FIG. 1 shows a side view of a field effect transistor featuring a gallium arsenide barrier layer.
Figure 2:
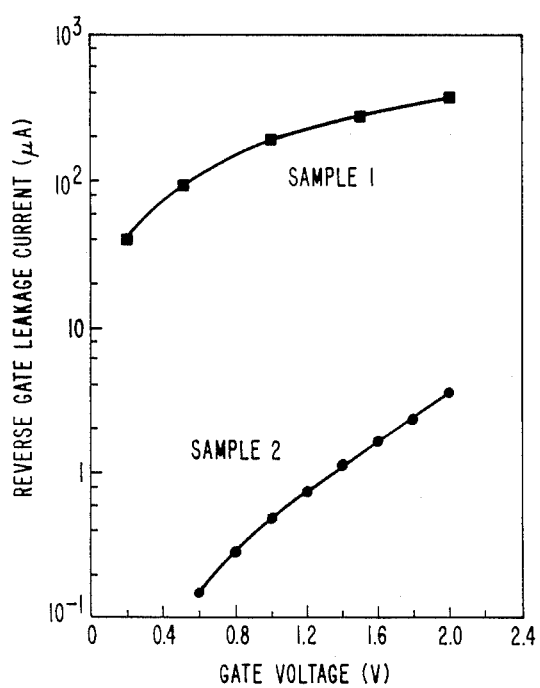
FIG. 2 shows the reverse gate leakage current as a function of gate voltage for two structures with different barrier layer thicknesses.

A typical FET semiconductor structure 10 using the gallium arsenide layer is shown in FIG. 1. The structure is grown on a (100) oriented semi-insulating (usually iron-doped) indium phosphide substrate 11. Epitaxial layers are typically grown on this substrate by molecular beam epitaxy (MBE). The active device layers consist of: first, a 600 Å thick undoped $Ga_{0.47}In_{0.53}As$ semi-insulating buffer layer 12; second, a 400 Å thick n-$Ga_{0.47}In_{0.53}As$ layer 13 doped with silicon to a concentration of $8 \times 10^{16}$ atoms per $cm^{-3}$, a 960 Å thick n-GaAs layer 14 doped with silicon to a concentration of about $10^{16}$ atoms per $cm^{-3}$ and a n+GaAs layer 15 with thickness of about 340 Å and silicon doping concentration of about $10^{18}$ atoms per $cm^{-3}$.

Various electrodes are also incorporated into the structure including a source 16, drain 17 (both typically made of germanium-gold) and a gate electrode 19 made of aluminum. Gate lengths were typically 1.4 μm and gate widths of about 240 μm. In various applications such as semiconductor devices and circuits, a plurality of FETs like that described above may be used, often mounted on the same substrate. Typical characteristics of the device are as follows: external transconductance $g_m = 104$ mS/mm at $V_{DS} = -3.5$ volts and $V_{GS} = -0.2$ volts; source resistance of 15 ohms for 240 μm gate widths.

The intrinsic transconductance is given by the formula:

$$g_{mo} = \frac{g_m}{1 - g_m R_s}$$

where $R_s$ is the source resistance and $g_m$ is the external transconductance. Intrinsic transconductances as high as 166 mS/mm are obtained with the structure described above. The transistor virtually has no hysteresis and shows complete pinch-off at $V_{GS} = -1.8$ volts.

Figure 3:
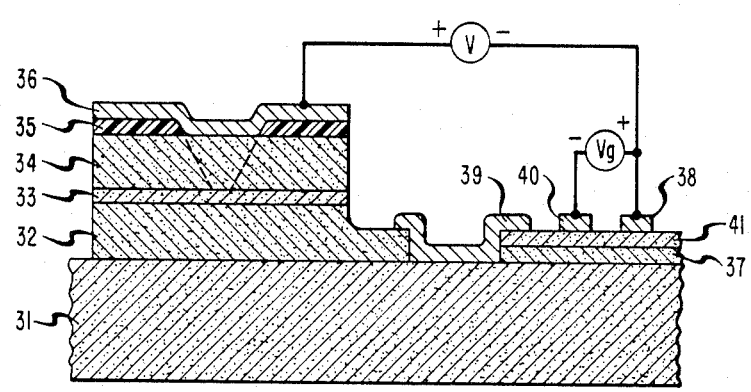
FIG. 3 shows a side view of a monolithically integrated FET-laser structure.

To further characterize the quality of the mismatched GaAs layer and understand its effect on device performance, certain FET devices were fabricated on wafers with thin and thick GaAs layers and their reverse gate leakage currents compared. Ni/Ge/Au was used as source and drain ohmic contacts and Al was deposited as gate metal. Both samples have a gate dimension of 1.4 μm×240 μm. FIG. 3 shows the typical reverse gate leakage currents of both samples. Sample 1 has a thin GaAs layer of about 580 Å; Sample 2 has a thick GaAs layer of about 1300 Å. It is clear that the devices made on a thick GaAs layer have a leakage current at least two orders of magnitude smaller than those of the thin layered sample. For example, Sample 1 has a leakage current of 200 μA at 1 V bias while Sample 2 has a leakage current of only 480 nA. Although the effect of doping levels in the GaAs layer can not be totally ruled out, the major cause for the reduced leakage current in the thick sample is believed to be the reduction in dislocation densities at the surface where Schottky barriers are formed. In the case of the thin-layered sample where Schottky barriers were made on the surface of highly dislocated GaAs, currents can leak through dislocations. We believe that further reduction in leakage currents can be achieved by improving crystal growth.

FIG. 3 shows a side view of a monolithically integrated circuit 30 consisting of a long wavelength (1.3-1.6 μm) laser and FET usefully made in accordance with the invention. The integrated circuit structure is made on a substrate of semi-insulating InP 31. The confinement layers 32 and 34 surround the active layer 33 of a buried heterostructure laser typically made of InGaAsP with composition which lattice-matches to InP and emits at the desired frequency. An insulating layer 35 is used to confine the current to a specific area and a metal contact layer 36 is used as the metal contact to the laser. The laser is driven by a FET circuit consisting of a channel layer 37 (usually InGaAs lattice-matched to InP), a drain contact 38 and source contact 39. The gate electrode 40 is formed on a GaAs layer 41. Such structures provide good integration, the possibility of mass production and reduced price together with excellent performance.

What is claimed is:

1. A semiconductor device comprising at least one semiconductor element, said element comprising
   a. first epitaxial region comprising InP or III-V semiconductor compound approximately lattice-matched to InP,
   b. gate electrode,
   c. a second epitaxial region contacting both first epitaxial region and gate electrode, said second epitaxial region consisting essentially of gallium arsenide with thickness greater than 700 Å, and
   d. substrate comprising semi-insulating indium phosphide said substrate contacting said first epitaxial layer.

2. The device of claim 1 in which the gallium arsenide thickness is greater than 800 Å.

3. The device of claim 2 in which the gallium arsenide thickness is between 1000 and 4000 Å.

4. The device of claim 3 in which the gallium arsenide thickness is approximately 1300 Å.

5. The device of claim 1 in which the semiconductor element is part of a field effect transistor comprising source electrode and drain electrode contacting either the first or second epitaxial region and the first and second epitaxial region exhibits n-type conductivity.

6. The device of claim 5 in which the first epitaxial region consists of at least one III-V semiconducting compound selected from the group consisting of InP, $In_{0.53}Ga_{0.47}As$ and $In_{0.52}Al_{0.48}As$.

7. The device of claim 6 in which the first epitaxial region consists of n-type $In_{0.53}Ga_{0.47}As$.

8. The device of claim 7 in which the source electrode and drain electrode contacts the second epitaxial region.

9. The device of claim 1 in which the device includes a semiconductor laser.

10. The device of claim 1 in which the device includes a photodetector.

* * * * *